(12) United States Patent
Kim et al.

(10) Patent No.: US 10,381,410 B2
(45) Date of Patent: Aug. 13, 2019

(54) ELECTRONIC DEVICE

(71) Applicant: SK hynix Inc., Icheon (KR)

(72) Inventors: Chi-Ho Kim, Yongin (KR); Eung-Rim Hwang, Seoul (KR); Sang-Hoon Cho, Gwacheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 16/178,256

(22) Filed: Nov. 1, 2018

(65) Prior Publication Data

US 2019/0221612 A1    Jul. 18, 2019

(30) Foreign Application Priority Data

Jan. 17, 2018 (KR) ........................ 10-2018-0005927

(51) Int. Cl.
*H01L 27/24* (2006.01)
*H01L 45/00* (2006.01)
(Continued)

(52) U.S. Cl.
CPC .... *H01L 27/2481* (2013.01); *H01L 27/11507* (2013.01); *H01L 27/11514* (2013.01);
(Continued)

(58) Field of Classification Search
CPC . H01L 27/24; H01L 27/2418; H01L 27/2472; H01L 27/2481; H01L 43/12;
(Continued)

(56) References Cited

U.S. PATENT DOCUMENTS 7,813,167 B2 * 10/2010 Porter ................ G11C 13/0004
365/148
9,520,186 B2 * 12/2016 Kim .................... G11C 13/0002
(Continued)

OTHER PUBLICATIONS

Ashish Agrawal et al., "A unified model for insulator selection to form ultra-low resistivity metal-insulator-semiconductor contacts to n-Si, n-Ge, and n-InGaAs", Applied Physics Letters, 2012, p. 042108-1-042108-4, vol. 101, American Institute of Physics.
(Continued)

*Primary Examiner* — Haissa Philogene

(57) ABSTRACT

An electronic device includes a semiconductor memory that includes: first and second lines spaced apart from each other and crossing each other; a third line spaced apart from the second line and crossing the second line; a first variable resistance element interposed between the first and second lines and overlapping an intersection of the first and second lines; a second variable resistance element interposed between the second and third lines and overlapping an intersection of the second and third lines, a part of the second variable resistance element generating a greater amount of heat than a part of the first variable resistance element when a current flows through the first variable resistance element in an opposite direction to a current flowing through the second variable resistance element; and a material layer serially connected with the second variable resistance element, disposed between the second and third lines, and exhibiting electrical resistance.

25 Claims, 13 Drawing Sheets

(51) Int. Cl.
*H01L 27/11507* (2017.01)
*H01L 27/22* (2006.01)
*H01L 27/11514* (2017.01)
*H01L 43/02* (2006.01)
*H01L 43/12* (2006.01)

(52) U.S. Cl.
CPC ............ *H01L 27/224* (2013.01); *H01L 43/02* (2013.01); *H01L 43/12* (2013.01); *H01L 45/06* (2013.01); *H01L 45/08* (2013.01); *H01L 45/1233* (2013.01); *H01L 45/1246* (2013.01); *H01L 45/1253* (2013.01); *H01L 45/1286* (2013.01); *H01L 45/1666* (2013.01); *H01L 27/2409* (2013.01)

(58) Field of Classification Search
CPC . H01L 43/08; H01L 45/1233; G11C 13/0023; G11C 13/0026; G11C 13/0028; G11C 13/0082; G11C 13/0007; G11C 2213/55; G11C 2213/71; G11C 2213/78; G11C 2213/32
See application file for complete search history.

(56) References Cited

U.S. PATENT DOCUMENTS 9,847,376 B2 * 12/2017 Yi .................... H01L 27/228
2013/0121060 A1 5/2013 Lee et al.
2017/0077395 A1 * 3/2017 Han .................. H01L 43/12

OTHER PUBLICATIONS

D. Ielmini et al., "Effects of threshold switching and parasitic capacitance in the programming transient of chalcogenide phase-change memories", ICMTD-2005, 2005, p. 195-198.
D. Tio Castro et al., "Evidence of the Thermo-Electric Thomson Effect and Influence on the Program Conditions and Cell Optimization in Phase-Change Memory Cells", 2007, p. 315-318, IEEE.
Derchang Kau et al., "A stackable cross point phase change memory", IEDM09-617, 2009, p. 27.1.1-27.1.4, IEEE.
Jenny Hu et al., "Metal/III-V Effective Barrier Height Tuning using ALD High-K Dipoles", 2011, p. 135-136, IEEE.

* cited by examiner

ELECTRONIC DEVICE

CROSS-REFERENCE TO RELATED APPLICATIONS

The present application claims priority to Korean Patent Application No. 10-2018-0005927, entitled "ELECTRONIC DEVICE" and filed on Jan. 17, 2018, which is incorporated by reference herein in its entirety.

TECHNICAL FIELD

This patent document relates to memory circuits and devices, and their applications in electronic devices or systems.

BACKGROUND

Recently, as electronic appliances trend toward miniaturization, low power consumption, high performance, multi-functionality, and so on, semiconductor devices capable of storing information in various electronic appliances, such as computers, portable communication devices, and so on, have been demanded in the art, and research has been conducted to develop such semiconductor devices. These semiconductor devices include semiconductor devices that can store data according to different resistance states. The semiconductor devices have a switching characteristic that allows them to switch between different resistance states according to an applied voltage or current. The semiconductor devices include, for example, resistive random access memories (RRAMs), phase change random access memories (PRAMs), ferroelectric random access memories (FRAMs), magnetic random access memories (MRAMs), E-fuses, etc.

SUMMARY

The technology disclosed in this patent document includes memory circuits and devices, as well as their applications in electronic devices or systems. In various implementations, a memory circuit is manufactured using a simplified process that prevents defects from occurring in the memory circuit.

In an implementation, an electronic device may be provided. The electronic device may include a semiconductor memory. The semiconductor memory may include: a first line; a second line being spaced apart from the first line and extending in a direction that crosses the first line; a third line being spaced apart from the second line and extending in a direction that crosses the second line; a first variable resistance element interposed between the first line and the second line, the first variable resistance element overlapping an intersection of the first line and the second line; a second variable resistance element interposed between the second line and the third line, the second variable resistance element overlapping an intersection of the second line and the third line, a part of the second variable resistance element being configured to generate a greater amount of heat than a part of the first variable resistance element when a direction of a current flowing through the first variable resistance element is opposite to a direction of a current flowing through the second variable resistance element; and a material layer connected in series with the second variable resistance element and disposed between the second line and the third line, the material layer exhibiting an electrical resistance.

Implementations of the above device may include one or more the following.

The material layer includes an insulating material having a sufficient thickness to exhibit the electrical resistance. The insulating material includes a metal oxide, a silicon oxide, a silicon nitride, or a combination thereof. The material layer is amorphous. A surface of the material layer is in contact with a first surface of the second variable resistance element and the surface of the material layer has a larger size than the first surface of the second variable resistance element. The material layer has a line shape that overlaps the second line, the third line, or both. The material layer has a flat plate shape. The direction of the current flowing through the second variable resistance element is a direction from the second line toward the third line, and the material layer is interposed between the second variable resistance element and the second line. The direction of the current flowing through the second variable resistance element is a direction from the third line toward the second line, and the material layer is interposed between the second variable resistance element and the third line. The first variable resistance element has substantially the same multi-layered structure as the second variable resistance element. The first variable resistance element includes a first variable resistance layer, a first electrode layer in contact with a first surface of the first variable resistance layer, and a second electrode layer in contact with a second surface of the first variable resistance layer, wherein the second variable resistance element includes a second variable resistance layer, a third electrode layer in contact with a first surface of the second variable resistance layer, and a fourth electrode layer in contact with a second surface of the second variable resistance layer, and wherein the first electrode layer and the third electrode layer include a first material, and the second electrode layer and the fourth electrode layer include a second material that has a different resistance from the first material. The first variable resistance element further includes a first selection element layer that is electrically coupled to the first variable resistance layer, the first electrode layer or the second electrode layer being disposed between the first variable resistance layer and the first selection element layer, and wherein the second variable resistance element further includes a second selection element layer that is electrically coupled to the second variable resistance layer, the third electrode layer or the fourth electrode layer being disposed between the second selection element layer and the second variable resistance layer. The semiconductor memory further includes: an additional material layer disposed over a sidewall of the second variable resistance element, the additional material connecting the second line and the third line and including the same material as the material layer. The additional material layer is electrically insulative.

In another implementation, an electronic device may be provided. The electronic device may include a semiconductor memory. The semiconductor memory may include: a first line extending in a first direction; a second line extending in a second direction crossing the first direction; a third line extending in the first direction; a first variable resistance element coupled between the first line and the second line; a second variable resistance element coupled between the second line and the third line, a part of the second variable resistance element being configured to generate a greater amount of heat than a part of the first variable resistance element when a direction of a current flowing through the first variable resistance element is opposite to a direction of a current flowing through the second variable resistance element; and an additional resistance component coupled in series to the second variable resistance element and disposed between the second line and the third line, the additional resistance component reducing a current flowing through the second variable resistance element.

Implementations of the above device may include one or more the following.

During operating the semiconductor memory, a current through the first variable resistance element flows in a direction from the second line toward the first line, a current through the second variable resistance element flows in a direction from the second line toward the third line, and the additional resistance component is coupled between the second line and the second variable resistance element. During operation of the semiconductor memory, a current through the first variable resistance element flows in a direction from the first line toward the second line, a current through the second variable resistance element flows in a direction from the third line toward the second line, and the additional resistance component is coupled between the third line and the second variable resistance element.

In another implementation, an electronic device may be provided. The electronic device may include a semiconductor memory. The semiconductor memory may include: a first line; a second line being spaced apart from the first line and extending in a direction crossing the first line; a third line being spaced apart from the second line and extending in a direction crossing the second line; a first variable resistance element interposed between the first line and the second line, the first variable resistance element overlapping an intersection of the first line and the second line and including a first electrode layer, a first variable resistance layer, and a second electrode layer, which are stacked in a direction from the first line toward the second line; a second variable resistance element interposed between the second line and the third line, the second variable resistance element overlapping an intersection of the second line and the third line and including a third electrode layer, a second variable resistance layer, and a fourth electrode layer, which are stacked in a direction from the second line toward the third line, where a difference in Seebeck coefficients between a material of the first and third electrode layers and a material of the first and second variable resistance layers is different from a difference in Seebeck coefficients between a material of the second and fourth electrode layers and the material of the first and second variable resistance layers; and a material layer coupled in series to the second variable resistance element and disposed between the second line and the third line, the material layer having an electrical resistance.

Implementations of the above device may include one or more the following.

The difference in the Seebeck coefficients between the material of the first and third electrode layers and the material of the first and second variable resistance layers is smaller than the difference in the Seebeck coefficients between the material of the second and fourth electrode layers and the material of the first and second variable resistance layers, wherein a current flows through the first variable resistance element in a direction from the second line to the first line and a current flows through the second variable resistance element in a direction from the second line toward the third line, and wherein the material layer is interposed between the second line and the second variable resistance element. The difference in the Seebeck coefficients between the material of the first and third electrode layers and the material of the first and second variable resistance layers is larger than the difference in the Seebeck coefficients between the material of the second and fourth electrode layers and the material of the first and second variable resistance layers, wherein a current flows through the first variable resistance element in a direction from the second line toward the first line and a current flows through the second variable resistance element in a direction from the second line toward the third line, and wherein the material layer is interposed between the second line and the first variable resistance element. The difference in the Seebeck coefficients between the material of the first and third electrode layers and the material of the first and second variable resistance layers is smaller than the difference in the Seebeck coefficients between the material of the second and fourth electrode layers and the material of the first and second variable resistance layers, wherein a current flows through the first variable resistance element in a direction from the first line to the second line and a current flows through the second variable resistance element in a direction from the third line toward the second line, and wherein the material layer is interposed between the first line and the first variable resistance element. The difference in the Seebeck coefficients between the material of the first and third electrode layers and the material of the first and second variable resistance layers is larger than the difference in the Seebeck coefficients between the material of the second and fourth electrode layers and the material of the first and second variable resistance layers, wherein a current flows through the first variable resistance element in a direction from the first line toward the second line and a current flows through the second variable resistance element from the third line toward the second line, and the material layer is interposed between the third line and the second variable resistance element. The material layer includes an insulating material having a sufficient thickness to exhibit the electrical resistance. The insulating material includes a metal oxide, a silicon oxide, a silicon nitride, or a combination thereof. The material layer is amorphous. A surface of the material layer is in contact with a first surface, the first surface being a surface of the second variable resistance element or a surface of the first variable resistance element, the surface of the material layer having a larger size than the first surface. The material layer has a line shape that overlaps the first line, the second line, the third line, or a combination thereof. The material layer has a flat plate shape. The first electrode layer and the third electrode layer include the same material, the second electrode layer and the fourth electrode layer include the same material, and the first variable resistance layer and the second resistance layer include the same material. The first variable resistance element further includes a first selection element layer that is electrically coupled to the first variable resistance layer, the first electrode layer or the second electrode layer being disposed between the first selection element layer and the first variable resistance layer, and wherein the second variable resistance element further includes a second selection element layer that is electrically coupled to the second variable resistance layer, the third electrode layer or the fourth electrode layer being disposed between the second selection element layer and the second variable resistance layer. The semiconductor memory further includes: an additional material layer disposed over a sidewall of the second variable resistance element, and connecting the second line and the third line, or the additional material layer disposed over a sidewall of the first variable resistance element and connecting the first line and the second line, the additional material layer including the same material as the material layer. The additional material layer is electrically insulative.

In another implementation, an electronic device may be provided. The electronic device may include a semiconductor memory. The semiconductor memory may include: a first line; a second line spaced apart from the first line, the second line extending in a direction that crosses the first line; a third line spaced apart from the second line, the third line extending in a direction that crosses the second line; a first variable resistance element interposed between the first line and the second line, the first variable resistance element overlapping an intersection of the first line and the second line and having a multi-layered structure including a first variable resistance layer; a second variable resistance element interposed between the second line and the third line, the second variable resistance element overlapping an intersection of the second line and the third line and having a multi-layered structure including a second variable resistance layer; and a material layer having an electrical resistance, wherein the material layer is interposed between the second variable resistance element and one of the second line and the third line, and wherein a current flow path to the second variable resistance layer is longer than a current flow path to the first variable resistance layer.

Implementations of the above device may include one or more the following.

The material layer includes an insulating material having a sufficient thickness to exhibit the electrical resistance. The insulating material includes a metal oxide, a silicon oxide, a silicon nitride, or a combination thereof. The material layer is amorphous. A surface of the material layer is in contact with a first surface of the second variable resistance element, the surface of the material layer having a larger size than the first surface. The material layer has a line shape that overlaps the second line, the third line, or both. The material layer has a flat plate shape. During operating the semiconductor memory, a direction of a current flowing through the first variable resistance element is opposite to a direction of a current flowing through the second variable resistance element. The direction of the current flowing through the second variable resistance element is a direction from the second line toward the third line, and wherein the material layer is interposed between the second variable resistance element and the second line. The direction of the current flowing through the second variable resistance element is a direction from the third line toward the second line, and wherein the material layer is interposed between the second variable resistance element and the third line. The semiconductor memory further includes: an additional material layer disposed over a sidewall of the second variable resistance element, the additional material layer connecting the second line and the third line and including the same material as the material layer. The additional material layer is electrically insulative.

In another implementation, an electronic device may be provided. The electronic device may include a semiconductor memory. The semiconductor memory may include: a first line; a second line being spaced apart from the first line and extending in a direction that crosses the first line; a third line being spaced apart from the second line and extending in a direction that crosses the second line; a first variable resistance element interposed between the first line and the second line, the first variable resistance element overlapping an intersection of the first line and the second line and including a first phase change material; a second variable resistance element interposed between the second line and the third line, the second variable resistance element overlapping an intersection of the second line and the third line and including a second phase change material, a magnitude of a current required for a phase change of the second phase change material being smaller than a magnitude of a current required for a phase change of the first phase change material when a direction of a current flowing through the first variable resistance element is opposite to a direction of a current flowing through the second variable resistance element; and a material layer connected in series with the second variable resistance element and disposed between the second line and the third line, the material layer exhibiting an electrical resistance.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

These and other aspects, implementations, and associated advantages are described in greater detail in the drawings, the description, and the claims.

DETAILED DESCRIPTION

Figure 1A:
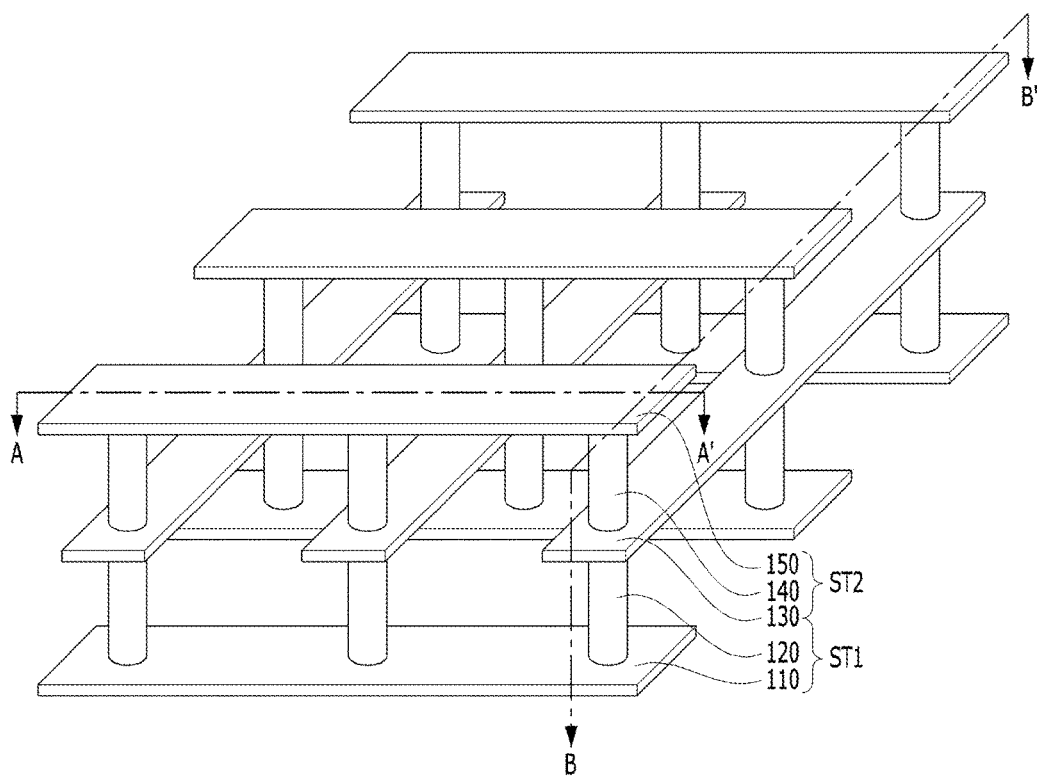
FIG. 1A is a perspective view illustrating a memory device according to an implementation of the disclosed technology.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of various examples or implementations. In presenting a specific example in a drawing or description having two or more layers in a multi-layer structure, the relative positioning relationship of such layers, or the sequence of arranging the layers, as shown, reflects a particular implementation for the described or illustrated example, and a different relative positioning relationship or sequence of arranging the layers may be possible in accordance with other implementations. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate, but may also represent a structure where one or more other intermediate layers may exist between the first layer and the second layer or the substrate.

Figure 1B:
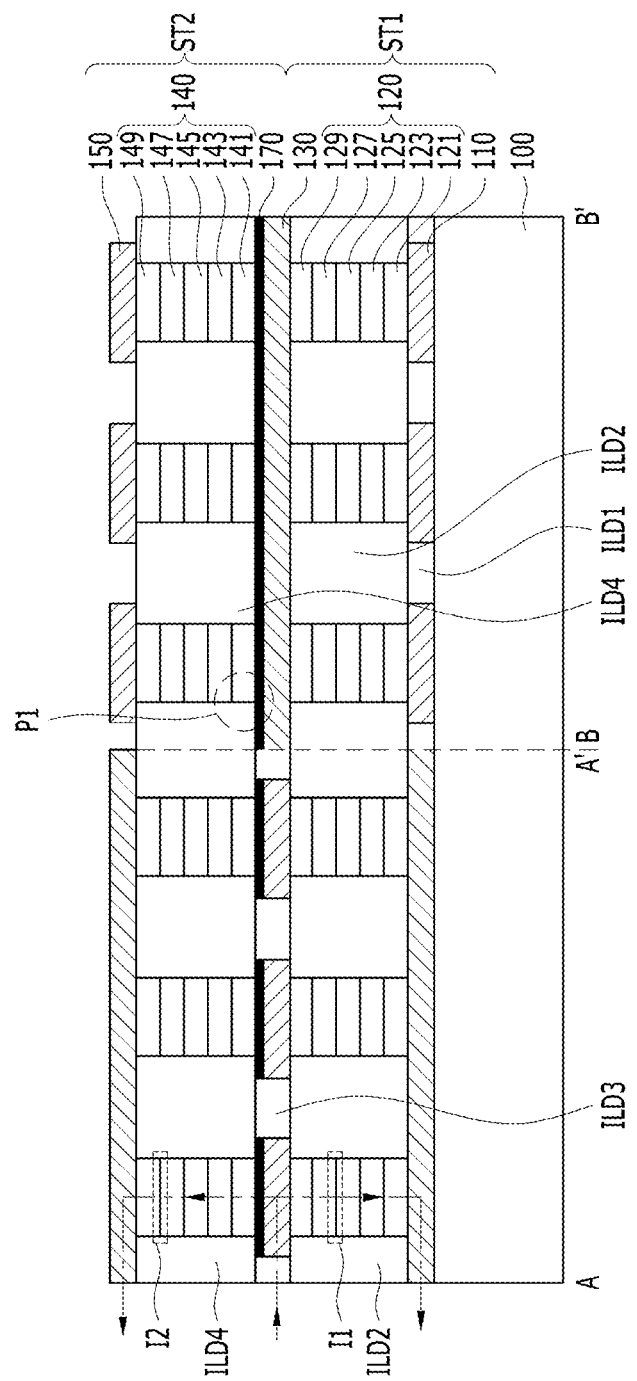
FIG. 1B is a cross-sectional view taken along a line A-A' and a line B-B' of FIG. 1A according to an implementation of the disclosed technology.
Figure 1C:
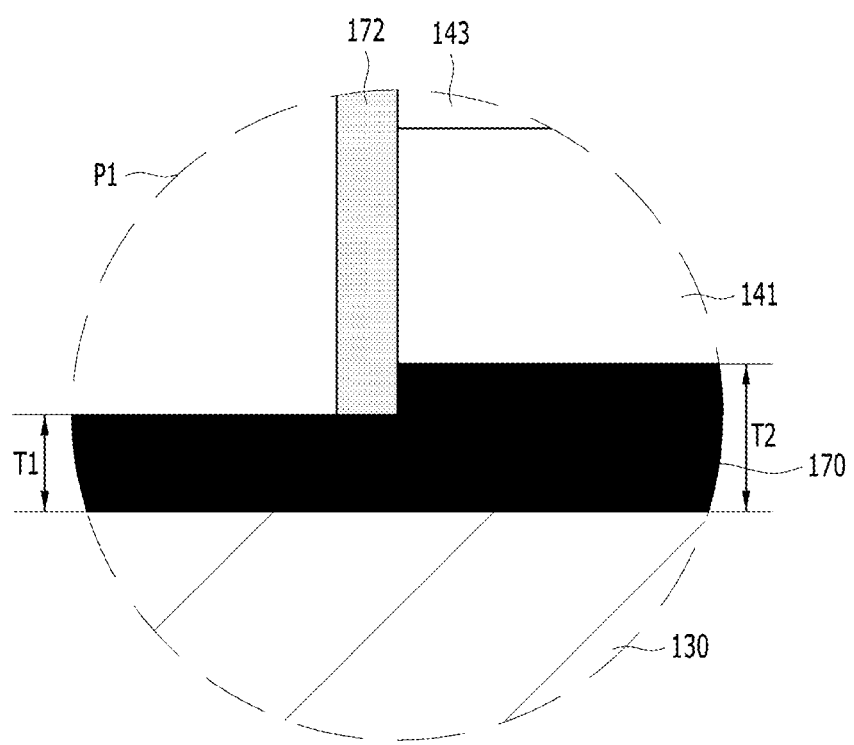
FIG. 1C is an enlarged view of a portion P1 of FIG. 1B according to an implementation of the disclosed technology.

FIG. 1A is a perspective view illustrating a memory device according to an implementation of the disclosed technology, FIG. 1B is a cross-sectional view taken along a line A-A' and a line B-B' of FIG. 1A according to an implementation of the disclosed technology, and FIG. 1C is an enlarged view of a portion P1 of FIG. 1B according to an implementation of the disclosed technology.

Referring to FIGS. 1A and 1B, the memory device according to the present implementation may include a first stack structure ST1 and a second stack structure ST2. The first stack structure ST1 may include first word lines 110, which are disposed over a substrate 100 and extend in a first direction; common bit lines 130, which are disposed over the first word lines 110 and extend in a second direction that crosses the first word lines 110, for example, a direction that is substantially perpendicular to the first word lines 110; and first variable resistance elements 120, which are interposed between the first word lines 110 and the common bit lines 130 and overlap intersections of the first word lines 110 and the common bit lines 130. In an example, the common bit lines 130 extending in the second direction are substantially perpendicular to the first word lines 110 extending in the first direction.

The second stack structure ST2 may include the common bit lines 130; second word lines 150, which are disposed over the common bit lines 130 and extend in the first direction; and second variable resistance elements 140, which are interposed between the common bit lines 130 and the second word lines 150 and overlap intersections of the common bit lines 130 and the second word lines 150. The second stack structure ST2 may further include a material layer 170 that is interposed between the common bit lines 130 and the second variable resistance elements 140.

The first word lines 110 and the common bit lines 130 may be coupled to lower ends and upper ends of the first variable resistance elements 120, respectively, and may supply a current or voltage to the first variable resistance elements 120. The common bit lines 130 and the second word lines 150 may be coupled to lower ends and upper ends of the second variable resistance elements 140, respectively, and may supply a current or voltage to the second variable resistance elements 140. The common bit lines 130 may be shared by the first stack structure ST1 and the second stack structure ST2, and may be used simultaneously for driving the first stack structure ST1 and the second stack structure ST2. The first word lines 110, the common bit lines 130, and the second word lines 150 may each have a single-layered structure or multi-layered structure. The first word lines 110, the common bit lines 130, and the second word lines 150 may each include various conductive materials, for example, a metal, such as any of Pt, Ir, Ru, Al, Cu, W, Ti, Ta, and the like; a metal nitride, such as any of TiN, TaN, WN, MoN, and the like; or a combination thereof.

Each of the first and second variable resistance elements 120 and 140 may include a material that switches between different resistance states according to an applied current or voltage, e.g., a current or voltage supplied to both of its ends. Each of the first and second variable resistance elements 120 and 140 thereby functions as a memory cell that can store different levels of data.

As an example, the first variable resistance element 120 may have a stacked structure, which includes a first lower electrode layer 121, a first selection element layer 123, a first middle electrode layer 125, a first variable resistance layer 127, and a first upper electrode layer 129 that are stacked in a third direction that is perpendicular to the first and second directions.

The first lower electrode layer 121 may be located at the lowermost portion of the first variable resistance element 120, and may provide a connection between the first word line 110 and the first variable resistance element 120. The first lower electrode layer 121 may have a single-layered structure or multi-layered structure, and may include a low-resistance conductive material, such as a metal, a metal nitride, or a combination thereof.

The first selection element layer 123 may have a threshold switching characteristic. That is, the first selection element layer 123 blocks a current when a magnitude of a voltage supplied between an upper end and a lower end of the first selection element layer 123 is lower than a predetermined threshold voltage, and conducts a current when the magnitude of the voltage is equal to or greater than the predetermined threshold voltage. Accordingly, the first selection element layer 123 controls access to the first variable resistance layer 127.

The first selection element layer 123 may include a diode; an ovonic threshold switching (OTS) material, such as a chalcogenide-based material; a mixed ion-electron conducting (MIEC) material, such as a metal-containing chalcogenide-based material; a metal insulator transition (MIT) material, such as any of $NbO_2$, $VO_2$, and the like; a tunneling dielectric layer that has a relatively wide band gap and includes any of $SiO_2$, $Al_2O_3$, and the like; or a combination thereof.

The first middle electrode layer 125 may physically separate the first selection element layer 123 and the first variable resistance layer 127, and may electrically connect the first selection element layer 123 to the first variable resistance layer 127. The first middle electrode layer 125 may include a different material than the first lower electrode layer 121 and/or the first upper electrode layer 129. For example, the first middle electrode layer 125 may include a conductive material having a higher resistance than a conductive material of the first lower electrode layer 121 and/or the first upper electrode layer 129.

The first variable resistance layer 127 may have a switching characteristic. That is, the first variable resistance layer 127 switches between different resistance states according to a voltage or current supplied between an upper end and a lower end of the first variable resistance layer 127. As an example, the first variable resistance layer 127 may have a single-layered structure or multi-layered structure, and may include a material used for any of an RRAM, a PRAM, an FRAM, an MRAM, and the like. In some examples, the first variable resistance layer 127 includes any of a metal oxide, such as a transition metal oxide or a perovskite-based material; a phase change material, such as a chalcogenide-based material; a ferroelectric material; a ferromagnetic material; and so on.

The first upper electrode layer 129 may be located at the uppermost portion of the first variable resistance element 120, and may provide a connection between the common bit line 130 and the first variable resistance element 120. The first upper electrode layer 129 may have a single-layered structure or multi-layered structure, and may include a low-resistance conductive material, such as a metal, a metal nitride, or a combination thereof.

The second variable resistance element 140 may have substantially the same structure as the first variable resistance element 120. As an example, the second variable resistance element 140 may have a stacked structure, which includes a second lower electrode layer 141, a second selection element layer 143, a second middle electrode layer 145, a second variable resistance layer 147, and a second upper electrode layer 149 that are stacked in the third direction. The second lower electrode layer 141, the second selection element layer 143, the second middle electrode layer 145, the second variable resistance layer 147, and the second upper electrode layer 149 may have the same materials and substantially the same thicknesses as the first lower electrode layer 121, the first selection element layer 123, the first middle electrode layer 125, the first variable resistance layer 127, and the first upper electrode layer 129, respectively.

In an implementation, each of the first variable resistance elements 120 may have an island shape, and may be located at each intersection of the first word lines 110 and the common bit lines 130. Each of the second variable resistance elements 140 may have an island shape, and may be located at each intersection of the common bit lines 130 and the second word lines 150. However, the shapes of the first and second variable resistance elements 120 and 140 may be variously modified, as long as the first and second variable resistance elements 120 and 140 overlap with the intersections of the first word lines 110 and the common bit lines 130 and with the intersections of the common bit lines 130 and the second word lines 150.

In some implementations, each of the first variable resistance elements 120 may have a line shape overlapping each of the first word lines 110, or another line shape overlapping each of the common bit lines 130, or may have a flat plate shape overlapping all of the first word lines 110 and the common bit lines 130. Each of the second variable resistance elements 140 may have a line shape overlapping each of the second word lines 150, or another line shape overlapping each of the common bit lines 130, or may have a flat plate shape overlapping all of the second word lines 150 and the common bit lines 130.

The material layer 170 may include an insulating material having a high dielectric constant, for example, a metal oxide, such as any of $Al_2O_3$, $TiO_2$, $HfO_2$, $ZrO_2$, and the like; a silicon oxide; a silicon nitride; or a combination thereof. The material layer 170 may be thin, and may show an ohmic behavior. That is, the material layer 170 may have an electrical resistance, such that a current flowing through the material layer 170 may vary in proportion to a voltage applied to the material layer 170, which may depend on an operating current or voltage of the present semiconductor memory. Even when the material layer 170 includes an insulating material, the material layer 170 may leak current, as long as the material layer 170 is relatively thin. As an example, the thickness of the material layer 170 may be 1 nanometers (nm) or more and may be 3 nm or less. Thus, the material layer 170 may reduce a current flowing through the material layer 170, without completely blocking the current.

The material layer 170 may be amorphous. In this case, a crystal growth of a layer formed over the material layer 170, for example, the second lower electrode layer 141 of the second variable resistance element 140, may be unaffected by the structure of the material layer 170.

In an implementation, the material layer 170 may be omitted from the first stack structure ST1, but may be included in the second stack structure ST2. In particular, the material layer 170 may be disposed between the common bit line 130 and the second variable resistance elements 140. The reason for the material layer 170 may be as follows.

The first stack structure ST1 and the second stack structure ST2 share the common bit line 130. A direction of a current flowing through the first variable resistance element 120 may be opposite to a direction of a current flowing through the second variable resistance element 140, when the first stack structure ST1 and the second stack structure ST2 are being operated. For example, as shown by a dashed-line arrow in FIG. 1B, the current flowing through the first variable resistance element 120 may flow in a downward direction from the common bit line 130 to the first word line 110, while the current flowing through the second variable resistance element 140 may flow in an upward direction from the common bit line 130 to the second word line 150.

Although the first variable resistance element 120 and the second variable resistance element 140 have similar stacked structures, one of the first and second variable resistance elements 120 and 140 may be more vulnerable to heat, compared to the other of the first and second variable resistance elements 120 and 140, when the semiconductor memory is being operated.

As an example, the second variable resistance element 140 may be more vulnerable to heat during operation of the semiconductor memory than the first variable resistance element 120. The second variable resistance element 140 may be more vulnerable to heat than the first variable resistance element 120 due to the arrangement and constituent materials of layers in the memory device. That is, when the first and second variable resistance layers 127 and 147 include a phase change material, such as GST, a temperature at a bottom portion of the first variable resistance layer 127, that is, at a first interface I1 between the first variable resistance layer 127 and the first middle electrode layer 125, may be lower than a temperature at a top portion of the second variable resistance layer 147, that is, at a second interface I2 between the second variable resistance layer 147 and the second upper electrode layer 149, when the current flowing into the first variable resistance layer 127 has the same magnitude as the current flowing into the second variable resistance layer 147. Specifically, when the first and second upper electrode layers 129 and 149 include a material having lower resistance than the first and second middle electrode layers 125 and 145, such as a metal or a metal nitride, a larger amount of heat may be generated at the interfaces between the first and second variable resistance layers 127 and 147 and the first and second upper electrode layers 129 and 149, compared to the interfaces between the first and second variable resistance layers 127 and 147 and the first and second middle electrode layers 125 and 145. The larger amount of heat generated at the interfaces between the first and second variable resistance layers 127 and 147 and the first and second upper electrode layers 129 and 149 is because of a larger difference in Seebeck coefficients between GST and the relatively low resistance conductive material of the first and second upper electrode layers 129 and 149, compared to a difference in Seebeck coefficients between GST and the relatively high resistance conductive material of the first and second middle electrode layers 125 and 145.

Without the material layer 170, the second interface I2 may be more likely to be damaged by heat during operation of the memory device, because more heat is generated at the second interface I2 compared to the first interface I1 when the same magnitude of current flows through the first and second variable resistance layers 127 and 147. Specifically, a burst phenomenon may occur at the second interface I2 due to the greater amount of heat generated at the second interface I2. When the burst phenomenon occurs at the second interface I2, defects may occur in the second variable resistance element 140.

Also, in the above case that the direction of the current flowing through the first variable resistance element 120 is opposite to the direction of the current flowing through the second variable resistance element 140 during operating the first stack structure ST1 and the second stack structure ST2, a magnitude of a current required for the phase change of the first variable resistance layer 127 and a magnitude of a current required for the phase change of the second variable resistance layer 147 may be different from each other although the first variable resistance element 120 and the second variable resistance element 140 have the same stacked structure and the first variable resistance layer 127 and the second variable resistance layer 147 have the same phase change material. This is because the magnitude of the current required for the phase change increases or decreases depending on a polarity of an applied current even if the same phase change material is used. For example, the magnitude of the current required for the phase change of the second variable resistance layer 147 may be smaller than the magnitude of the current required for the phase change of the first variable resistance layer 127, depending on the difference in the current direction. Therefore, if the material layer 170 is not present, a failure may occur in which a phase change of the second variable resistance layer 147 unintentionally occurs in a state where a small current, for example, a read current is applied.

In the present implementation, to prevent the occurrence of the above defects, the material layer 170 may be disposed between the common bit line 130 and the second variable resistance element 140, so that a magnitude of a current flowing from the common bit line 130 to the second variable resistance element 140 may be lower than a magnitude of a current flowing from the common bit line 130 to the first variable resistance element 120. As a result, the greater heat generation at the second interface I2 may be reduced, and the burst phenomenon at the second interface I2 may be prevented.

In the present implementation, the material layer 170 may overlap the common bit line 130 and have substantially the same shape as the common bit line 130. That is, the material layer 170 may have a line shape extending in the second direction. However, as long as the material layer 170 is interposed between the common bit line 130 and the second variable resistance element 140, the shape of the material layer 170 may be variously modified.

Meanwhile, an example of a method for fabricating the memory device of FIGS. 1A and 1B will be described below.

First, the first word lines 110 extending in the first direction may be formed by depositing a conductive material over the substrate 100, in which a predetermined lower structure (not shown) is formed, and selectively etching the conductive material. Then, a first interlayer insulating layer ILD1 filled between the first word lines 110 may be formed by forming an insulating material covering the first word lines 110 and the substrate 100 and performing a planarization process, for example, a Chemical Mechanical Polishing (CMP) process, until the first word lines 110 are exposed.

Then, the first variable resistance elements 120 may be formed by depositing a plurality of layers over the first interlayer insulating layer ILD1 and the first word lines 110, and selectively etching the plurality of layers. Then, a second interlayer insulating layer ILD2 may be formed between the first variable resistance elements 120.

Subsequently, stack structures, each including the common bit line 130 and the material layer 170, may be formed by sequentially depositing a conductive material and an insulating material over the second interlayer insulating layer ILD2 and the first variable resistance elements 120, and selectively etching the conductive material and the insulating material. The stack structure of the common bit line 130 and the material layer 170 may extend in the second direction and be coupled to the first variable resistance elements 120 arranged in the second direction. Then, a third interlayer insulating layer ILD3 may be formed between the stack structures of the common bit line 130 and the material layer 170.

Then, the second variable resistance elements 140 arranged in the first direction and the second direction and located over the stack structures of the common bit line 130 and the material layer 170 may be formed by depositing a plurality of layers over the third interlayer insulating layer ILD3 and the stack structures of the common bit line 130 and the material layer 170, and selectively etching the plurality of layers. Then, a fourth interlayer insulating layer ILD4 may be formed between the second variable resistance elements 140.

When the plurality of layers are being etched to form the second variable resistance elements 140, an over etching may be performed, in order to completely separate the second variable resistance elements 140 from each other. As a result of the over etching, a portion of the material layer 170 exposed by the second variable resistance element 140 may be etched to a predetermined thickness. As shown in FIG. 1C, a first thickness T1 of a portion of the material layer 170 that is exposed by the second variable resistance element 140, may be smaller than a second thickness T2 of a portion of the material layer 170 that overlaps the second variable resistance element 140.

Also, during the etching process for forming the second variable resistance element 140, a process, in which etch by-products are redeposited on a sidewall of a layer being etched and are re-etched, may be repeated. As a result, etch by-products 172 resulting from the most recently etched layer may be deposited over a sidewall of the second variable resistance element 140. In the present implementation, the most recently etched layer may be the material layer 170, so the etch by-products 172 deposited on the sidewall of the second variable resistance element 140 may be due to etching the material layer 170. Since the material layer 170 includes an insulating material, the etch by-products 172 may prevent current leakage, even when no additional oxidation process is performed on the sidewall of the second variable resistance element 140. For this purpose, a surface of the material layer 170 may be in contact with a bottom surface of the second variable resistance element 140, but may have a larger size than the bottom surface of the second variable resistance element 140.

Referring again to FIGS. 1A and 1B, the second word lines 150 may be formed by depositing a conductive material over the fourth interlayer insulating layer ILD4 and the second variable resistance elements 140, and selectively etching the conductive material.

Accordingly, the memory device of FIGS. 1A and 1B may be fabricated. According to the memory device of FIGS. 1A and 1B and the fabricating method described above, it may be possible to prevent defects from being formed in the memory device, simplify processes for manufacturing the memory device, and reduce the cost of the memory device.

Specifically, in a case in which the first variable resistance element 120 and the second variable resistance element 140 have the same shape, if the material layer 170 is omitted, one of the first variable resistance element 120 and the second variable resistance element 140 may be defective due to an asymmetry of heat generation by an asymmetry in the directions of currents flowing through the memory device. However, according to the present implementation, this defect may be prevented by including the material layer 170, which is capable of reducing a current flowing into one of the first stack structure ST1 and the second stack structure ST2 and therefore of reducing an amount of heat generated through one of the first stack structure ST1 and the second stack structure ST2.

Also, when the material layer 170 includes an insulating material and is located under the second variable resistance element 140, the etch by-products 172 redeposited over the sidewall of the second variable resistance element 140 may have an insulating property. That is, the etch by-products 172 are electrically insulative. Therefore, there may be no need for performing an additional oxidation process on the sidewall of the second variable resistance element 140, which simplifies and reduces the cost of the method of fabricating the memory device.

Figure 1D:
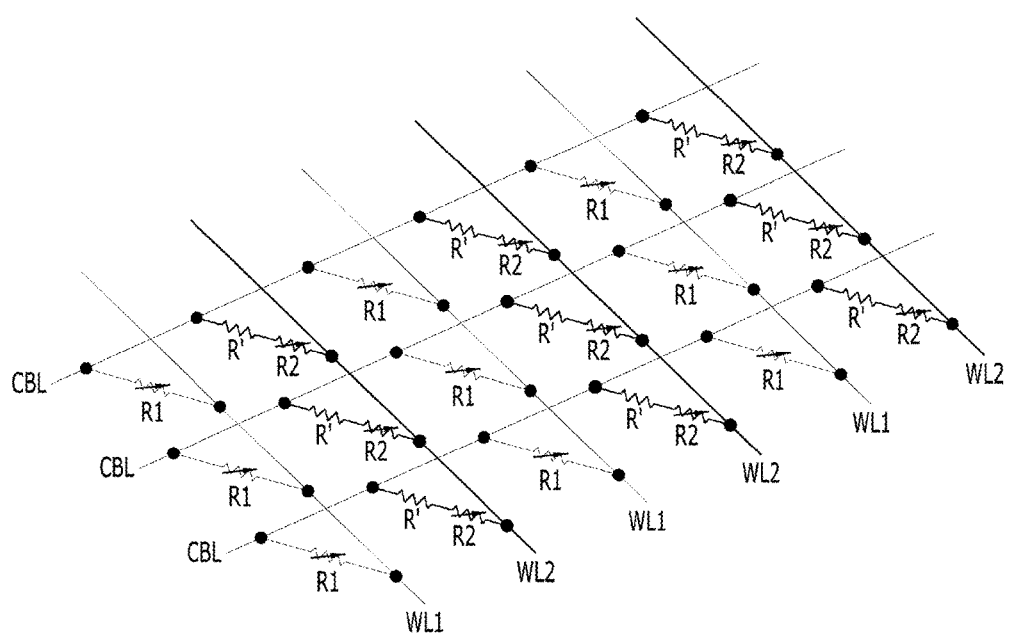
FIG. 1D is a circuit diagram corresponding to the memory device of FIGS. 1A and 1B according to an implementation of the disclosed technology.

FIG. 1D is a circuit diagram corresponding to the memory device illustrated in FIGS. 1A through 1C according to an implementation of the disclosed technology.

Referring to FIG. 1D, the circuit diagram includes first word lines WL1 extending in a first direction, second word lines WL2 extending in the first direction, and common bit lines CBL extending in a second direction that is perpendicular to the first direction.

A first variable resistance element R1 may be connected between each of the first word lines WL1 and each of the common bit lines CBL, and a second variable resistance element R2 may be connected between each of the second word lines WL2 and each of the common bit lines CBL. That is, first and second ends of each first variable resistance element R1 may be coupled to one of the first word lines WL1 and one of the common bit lined CBL, respectively, and first and second ends of each second variable resistance element R2 may be coupled to one of the second word lines WL2 and one of the common bit lines CBL, respectively.

When the second variable resistance element R2 is more vulnerable to heat than the first variable resistance element R1 during operation of the memory device, an additional resistance component R' may be connected in series to one end of the second variable resistance element R2. The additional resistance component R' may reduce a current that flows through the second variable resistance element R2. In the present implementation, a current may flow from the common bit line CBL toward the first and second word lines WL1 and WL2. The additional resistance component R' connected between the common bit line CBL and the second variable resistance element R2 may reduce a current flowing from the common bit line CBL toward the second variable resistance element R2. Therefore, heat generated in the second variable resistance element R2 may be reduced, and heat-generated defects in the second variable resistance element R2 may be prevented.

Although not shown, in another implementation, when the first variable resistance element R1 is more vulnerable to heat than the second variable resistance element R2 during operation of the memory device, the additional resistance component R' may be connected in series to one end of the first variable resistance element R1. For example, the additional resistance component R' may be connected between the common bit line CBL and the first variable resistance element R1.

Also, although not shown, in an implementation, there may be first and second bit lines and a common word line, and currents may flow from the first and second bit lines to the common word line through first and second variable resistance elements. In this case, an additional resistance component may be connected between the first variable resistance element, which is more vulnerable to heat than the second variable resistance element, and the bit line that is coupled to the first variable resistance element.

Meanwhile, as described above, the shape of the material layer 170 can be variously modified as long as the material layer 170 is interposed between the common bit line 130 and the second variable resistance element 170. As an example, the material layer 170 may have a flat plate shape. This will be described with reference to FIG. 2A below.

Figure 2A:
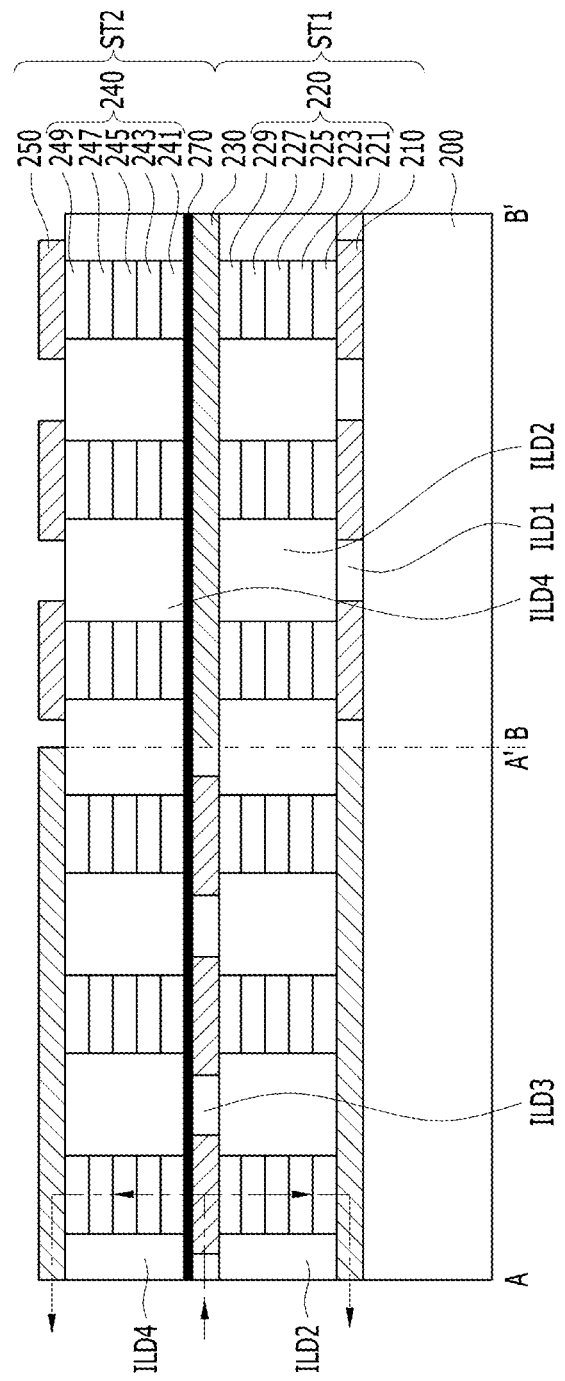
FIG. 2A is a cross-sectional view illustrating a memory device according to an implementation of the disclosed technology.

FIG. 2A is a cross-sectional view illustrating a memory device according to an implementation of the disclosed technology.

Referring to FIG. 2A, the memory device according to the present implementation may include a first stack structure ST1 and a second stack structure ST2. The first stack structure ST1 may include first word lines 210, which are disposed over a substrate 200 and extend in a first direction; common bit lines 230, which are disposed over the first word lines 210 and extend in a second direction that crosses the first word lines 210; and first variable resistance elements 220, which are interposed between the first word lines 210 and the common bit lines 230 and overlap intersections of the first word lines 210 and the common bit lines 230. The common bit lines 230 extending in the second direction are, for example, substantially perpendicular to the first word lines 210 extending in the first direction. The second stack structure ST2 may include the common bit lines 230; second word lines 250, which are disposed over the common bit lines 230 and extend in the first direction; and second variable resistance elements 240, which are interposed between the common bit lines 230 and the second word lines 250 and overlap intersections of the common bit lines 230 and the second word lines 250. Furthermore, the second stack structure ST2 may further include a material layer 270 that is interposed between the common bit lines 230 and the second variable resistance elements 240.

Here, the material layer 270 may have a flat plate shape. In other words, the material layer 270 may be a continuous structure that covers all of the top surfaces of the common bit lines 230 and covers a third interlayer insulating layer ILD3 disposed between the common bit lines 230.

In the above implementations of FIGS. 1A to 2A, the second variable resistance elements 140 and 240 may be more vulnerable to heat than the first variable resistance elements 120 and 220. However, in another implementation, the first variable resistance elements 120 and 220 may be more vulnerable to heat than the second variable resistance elements 140 and 240. This will be illustratively described with reference to FIGS. 2B and 2C.

Figure 2B:
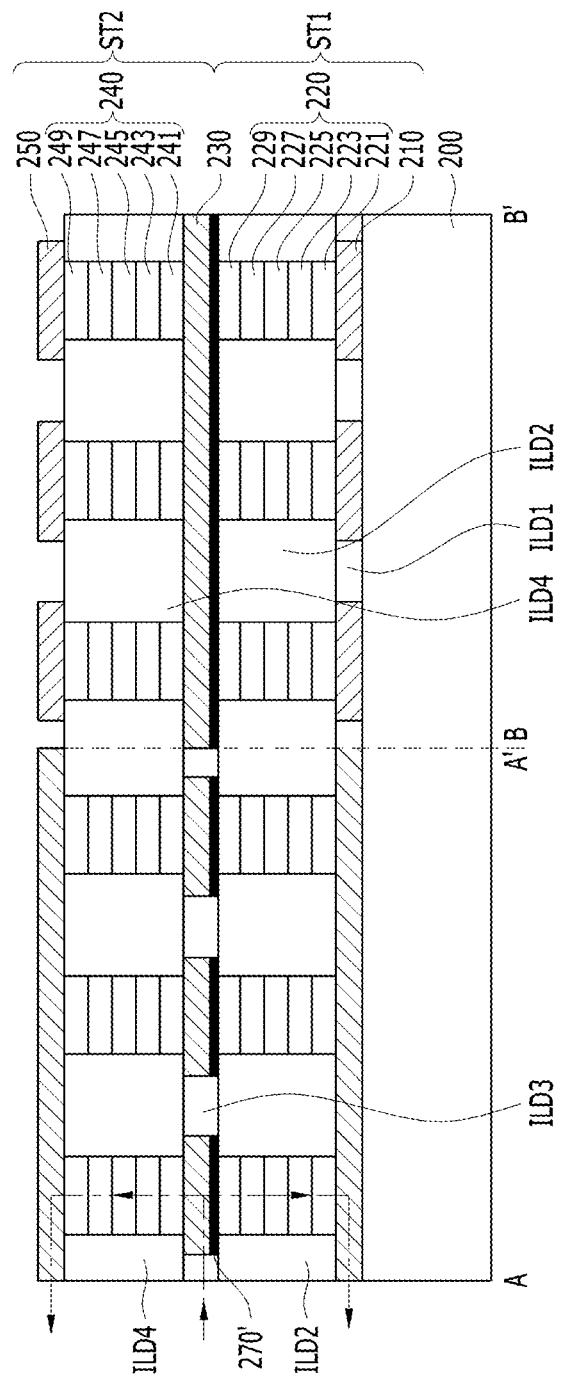
FIG. 2B is a cross-sectional view illustrating a memory device according to san implementation of the disclosed technology.

FIG. 2B is a cross-sectional view illustrating a memory device according to an implementation of the disclosed technology.

Referring to FIG. 2B, the memory device according to the present implementation may include a first stack structure ST1 and a second stack structure ST2. The first stack structure ST1 may include first word lines 210, which are disposed over a substrate 200 and extend in a first direction; common bit lines 230, which are disposed over the first word lines 210 and extend in a second direction; and first variable resistance elements 220, which are interposed between the first word lines 210 and the common bit lines 230 and overlap intersections of the first word lines 210 and common bit lines 230. The second stack structure ST2 may include the common bit lines 230; second word lines 250, which are disposed over the common bit lines 230 and extend in the first direction; and second variable resistance elements 240, which are interposed between the common bit lines 230 and the second word lines 250 and overlap intersections of the common bit lines 230 and the second word lines 250. Furthermore, the first stack structure ST1 may further include a material layer 270' that is interposed between the common bit lines 230 and the first variable resistance elements 220.

Here, a current in the first variable resistance element 220 may flow in a downward direction from the common bit line 230 to the first word line 210, while a current in the second variable resistance element 240 flows in an upward direction from the common bit line 230 to the second word line 250. Therefore, when the currents are equal, a temperature at a bottom portion of the first variable resistance layer 227, that is, at an interface with the first middle electrode layer 225, is higher than a temperature at a top portion of the second variable resistance layer 247, that is, at an interface with the second upper electrode layer 249. When the first and second upper electrode layers 229 and 249 include a material having higher resistance than the first and second middle electrode layers 225 and 245, a larger amount of heat may be generated at the interfaces between the first and second variable resistance layers 227 and 247 and the first and second middle electrode layers 225 and 245, compared to the interfaces between the first and second variable resistance layers 227 and 247 and the first and second upper electrode layers 229 and 249. Accordingly, the interface between the first variable resistance layer 227 and the first middle electrode layer 225 may be more likely to be damaged by heat during operation of the memory device, compared to the interface between the second variable resistance layer 247 and the second upper electrode layer 249.

However, when the material layer 270' is interposed between the common bit line 230 and the first variable resistance element 220, the current flowing into the first variable resistance element 220 is reduced. As a result, defects in the first variable resistance layer 227 are prevented.

In the present implementation, the material layer 270' may be patterned together with the common bit line 230, and may have the same line shape as the common bit line 230. However, unlike the implementation of FIG. 1B, the material layer 270' may be located under the common bit line 230. That is, the material layer 270' may be disposed between the common bit line 230 and the first variable resistance element 220. Specifically, the material layer 270' and the common bit line 230 may be formed by sequentially depositing an insulating material corresponding to the material layer 270' and a conductive material corresponding to the common bit line 230, and then selectively etching the insulating material and the conductive material using one mask.

However, as long as the material layer 270' is interposed between the common bit line 230 and the first variable resistance element 220, the shape of the material layer 270' may be variously modified. For example, the material layer 270' may have a flat plate shape. This will be described with reference to FIG. 2C.

Figure 2C:
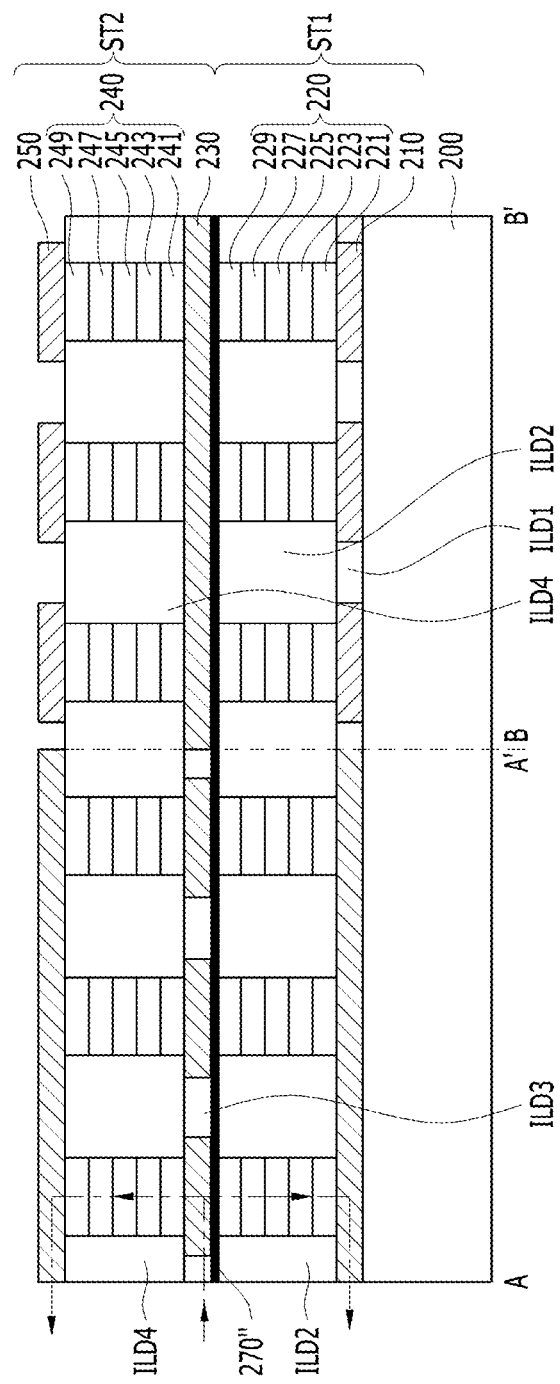
FIG. 2C is a cross-sectional view illustrating a memory device according to an implementation of the disclosed technology.

FIG. 2C is a cross-sectional view illustrating a memory device according to an implementation of the disclosed technology.

Referring to FIG. 2C, a material layer 270" may have a flat plate shape. In other words, the material layer 270" may be a continuous structure covering all of top surfaces of the first variable resistance elements 220 and covering a second interlayer insulating layer ILD2 that is disposed between the first variable resistance elements 220.

Figure 3A:
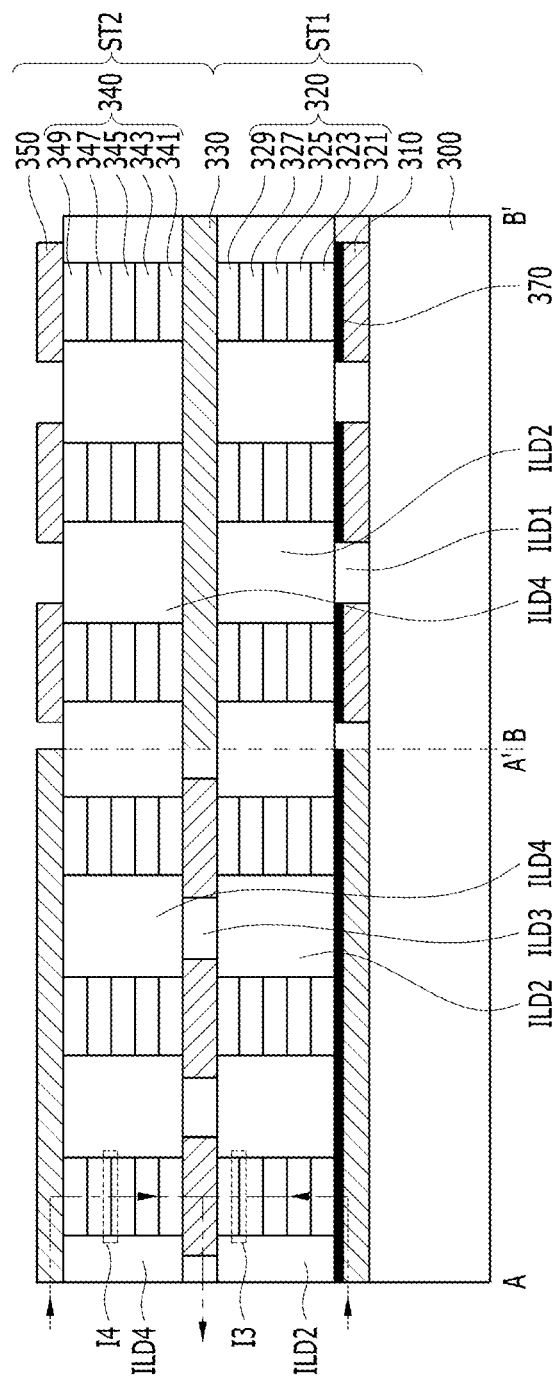
FIG. 3A is a cross-sectional view illustrating a memory device according to an implementation of the disclosed technology.

FIG. 3A is a cross-sectional view illustrating a memory device according to an implementation of the disclosed technology.

Referring to FIG. 3A, the memory device according to the present implementation may include a first stack structure ST1 and a second stack structure ST2. The first stack structure ST1 may include first bit lines 310, which are disposed over a substrate 300 and extend in a first direction; common word lines 330, which are disposed over the first bit lines 310 and extend in a second direction crossing the first direction; and first variable resistance elements 320, which are interposed between the first bit lines 310 and the common word lines 330 and overlap intersections of the first bit lines 310 and the common word lines 330. The common word lines 330 extending in the second direction are, for example, perpendicular to the first bit lines 310 extending in the first direction. The second stack structure ST2 may include the common word lines 330, second bit lines 350, which are disposed over the common word lines 330 and extend in the first direction; and second variable resistance elements 340, which are interposed between the common word lines 330 and the second bit lines 350 and overlap intersections of the common word lines 330 and the second bit lines 350. Furthermore, the first stack structure ST1 may further include a material layer 370 that is interposed between the first bit lines 310 and the first variable resistance elements 320.

As an example, the first variable resistance element 320 may have a structure in which a first lower electrode layer 321, a first selection element layer 323, a first middle electrode layer 325, a first variable resistance layer 327, and a first upper electrode layer 329 are stacked. The second variable resistance element 340 may have substantially the same structure as the first variable resistance element 320. That is, the second variable resistance element 340 may have a structure in which a second lower electrode layer 341, a second selection element layer 343, a second middle electrode layer 345, a second variable resistance layer 347, and a second upper electrode layer 349 are stacked.

Unlike the implementation of FIGS. 1A and 1B described above, the first stack structure ST1 and the second stack structure ST2 may share the common word lines 330 in the present implementation. Accordingly, during operation of the first stack structure ST1 and the second stack structure ST2, a direction of a current flowing through the first variable resistance element 320 and a direction of a current flowing through the second variable resistance element 340 may be the opposite of the currents described in the implementation of FIGS. 1A and 1B. For example, as shown by dotted-line arrows in FIG. 3A, a current in the first variable resistance element 320 may flow in an upward direction from the first bit line 310 to the common word line 330, while a current in the second variable resistance element 340 flows in a downward direction from the second bit line 350 to the common word line 330. Therefore, even when the first variable resistance element 320 and the second variable resistance element 340 have the same stacked structure, one of the first and second variable resistance elements 320 and 340 may be more vulnerable to heat during operation of the memory device, compared to the other of the first and second variable resistance elements 320 and 340.

As an example, the first variable resistance element 320 may be more vulnerable to heat than the second variable resistance element 340. In other words, a temperature at a top portion of the first variable resistance layer 327, that is, at a third interface 13 between the first variable resistance layer 327 and the first upper electrode layer 329, may be greater than a temperature at a bottom portion of the second variable resistance layer 347, that is, at a fourth interface 14 between the second variable resistance layer 347 and the second middle electrode layer 343, when the current of the first variable resistance layer 327 and the current of the second variable resistance layer 347 have the same magnitude. Specifically, when the first and second upper electrode layers 329 and 349 include a material having a lower resistance than the first and second middle electrode layers 325 and 345, a larger amount of heat may be generated at the interfaces between the first and second variable resistance layers 327 and 347 and the first and second upper electrode layers 329 and 349, compared to the interfaces between the first and second variable resistance layers 327 and 347 and the first and second middle electrode layers 325 and 345. Therefore, without the material layer 370, the third interface 13 may be more vulnerable to heat during operation of the memory device, compared to the fourth interface 14, and a burst phenomenon may occur at the third interface 13. Due to the burst phenomenon, defects may occur in the first variable resistance element 320.

In an implementation, the material layer 370 may be disposed between the first bit line 310 and the first variable resistance element 320, in order to prevent the occurrence of the defects in the first variable resistance element 320. The material layer 370 reduces the current flowing from the first bit line 310 to the first variable resistance element 320, such that it is lower than the current flowing from the second bit line 350 to the second variable resistance element 340. Accordingly, the heat generation at the third interface 13 may be reduced. As a result, the burst phenomenon at the third interface 13, and the defects in the first variable resistance element 320, may be prevented.

In the present implementation, the material layer 370 may overlap the first bit line 310 and have substantially the same shape as the first bit line 310. That is, the material layer 370 may have a line shape extending in the first direction. However, as long as the material layer 370 is interposed between the first bit line 310 and the first variable resistance element 320, the shape of the material layer 370 may be variously modified. For example, although not shown, the material layer 370 may have a flat plate shape.

Also, although not shown in FIG. 3A, in an over etching process for forming the first variable resistance element 320, the material layer 370 may be etched to a predetermined thickness. Therefore, a thickness of a portion of the material layer 370 that is exposed by the first variable resistance element 320 may be smaller than a thickness of another portion of the material layer 370 that overlaps the first variable resistance element 320. Over a sidewall of the first variable resistance element 320, a sidewall spacer (not shown), which includes substantially the same insulating material as the material layer 370, may be formed.

Figure 3B:
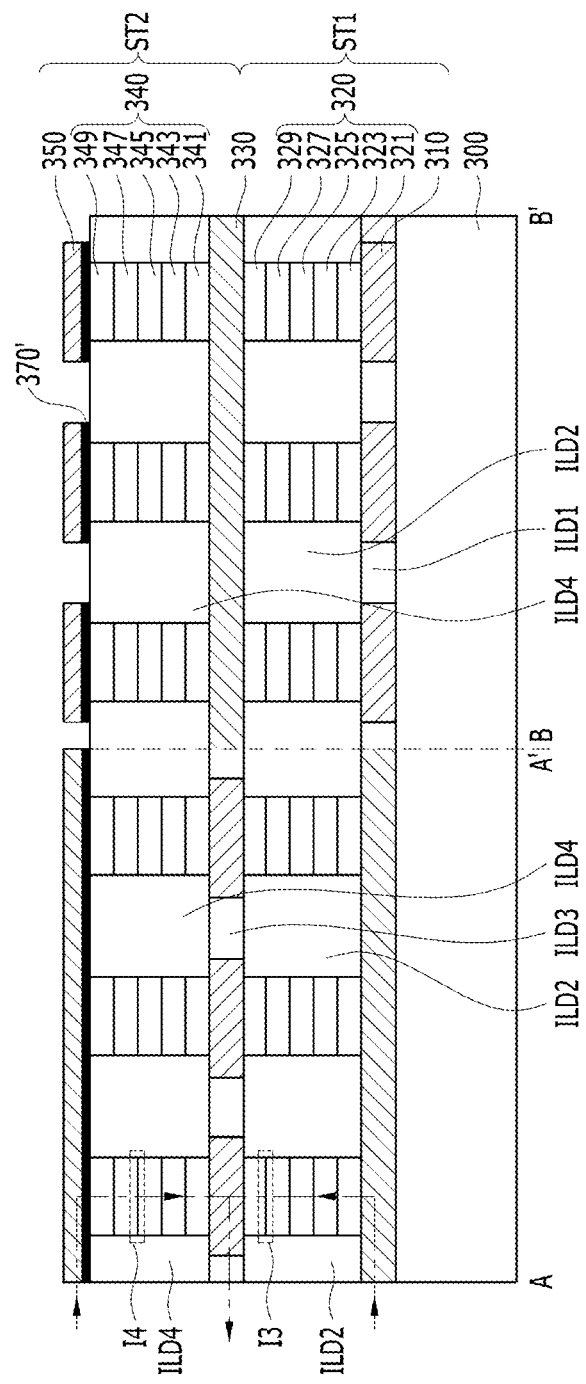
FIG. 3B is a cross-sectional view illustrating a memory device according to an implementation of the disclosed technology.

FIG. 3B is a cross-sectional view illustrating a memory device according to an implementation of the disclosed technology.

Referring to FIG. 3B, unlike the implementation of FIG. 3A, the second variable resistance element 340 may be more vulnerable to heat than the first variable resistance element 320 during operation of the memory device, and the material layer 370' may be interposed between the second bit line 350 and the second variable resistance element 340, in order to reduce a current flowing from the second bit line 350 to the second variable resistance element 340. In this case, the material layer 370' may have a line shape, which overlaps the second bit line 350. Alternatively, although not shown, the material layer 370' may have a flat plate shape that covers all of the top surfaces of the second variable resistance elements 340 and a fourth interlayer insulating layer ILD4 disposed between the second variable resistance elements 340.

While various implementations have been described, the present disclosure is not limited thereto. When two or more stack structures sharing a line exist, and a variable resistance element of any one of the stack structures is more vulnerable to heat compared to a variable resistance element of another one of the stack structures during operation of the stack structures, various implementations may possible, as long as an insulating material is interposed between the variable resistance element of the any one of the stack structures and the line.

The above and other memory circuits or semiconductor devices based on the disclosed technology can be used in a range of devices or systems. FIGS. 4-8 provide some examples of devices or systems that can implement the memory circuits disclosed herein.

Figure 4:
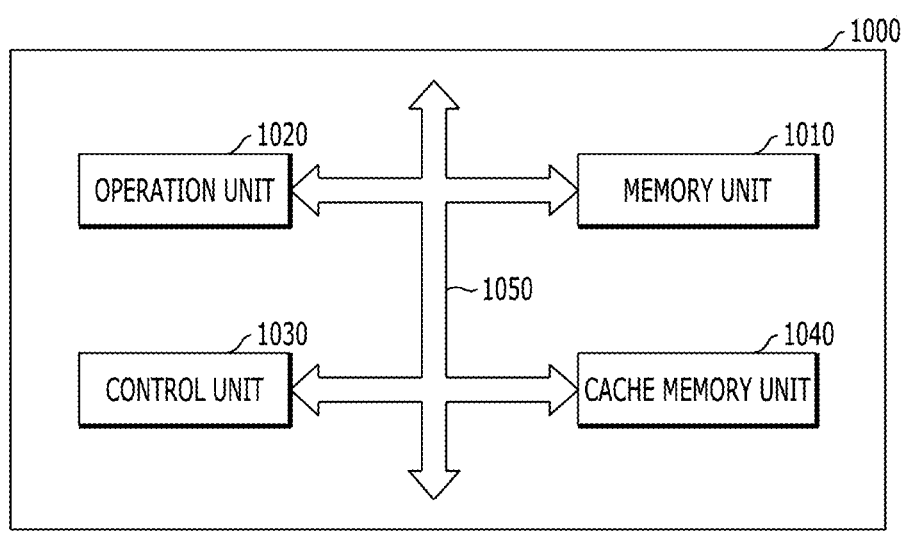
FIG. 4 is an example of configuration diagram of a microprocessor implementing memory circuitry according to an implementation of the disclosed technology.

FIG. 4 is an example of configuration diagram of a microprocessor implementing memory circuitry according to an implementation of the disclosed technology.

Referring to FIG. 4, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may include various data processing units such as a central processing unit (CPU), a graphic processing unit (GPU), a digital signal processor (DSP), and an application processor (AP).

The memory unit 1010 is a part which stores data in the microprocessor 1000, as a processor register, a register, or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations.

For example, the memory unit 1010 may include a first line; a second line spaced apart from the first line and extending in a direction crossing the first line; a third line spaced apart from the second line and extending in a direction crossing the second line; a first variable resistance element interposed between the first line and the second line and overlapping an intersection of the first line and the second line; a second variable resistance element interposed between the second line and the third line and overlapping an intersection of the second line and the third line, the second variable resistance element being more vulnerable to heat generated during operating the semiconductor memory, compared to the first variable resistance element; and a material layer interposed between the second variable resistance element and the second line or between the second variable resistance element and the third line, and showing an ohmic behavior in an operating current or voltage of the semiconductor memory. Through this, fabricating processes may be simplified and defects may be prevented in the memory unit 1010. As a consequence, fabricating processes may be simplified and defects may be prevented in the microprocessor 1000.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 5:
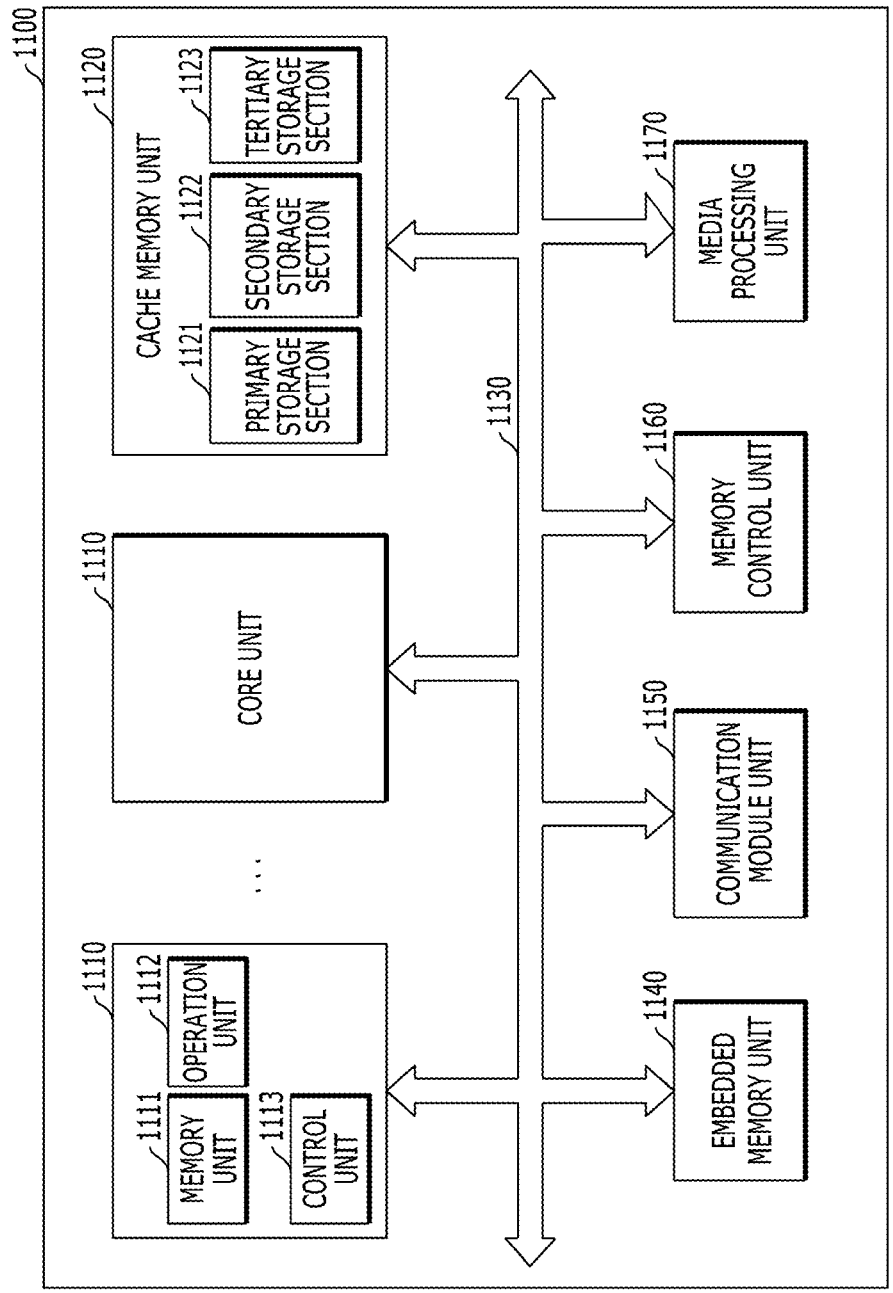
FIG. 5 is an example of configuration diagram of a processor implementing memory circuitry according to an implementation of the disclosed technology.

FIG. 5 is an example of configuration diagram of a processor implementing memory circuitry according to an implementation of the disclosed technology.

Referring to FIG. 5, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a first line; a second line spaced apart from the first line and extending in a direction crossing the first line; a third line spaced apart from the second line and extending in a direction crossing the second line; a first variable resistance element interposed between the first line and the second line and overlapping an intersection of the first line and the second line; a second variable resistance element interposed between the second line and the third line and overlapping an intersection of the second line and the third line, the second variable resistance element being more vulnerable to heat generated during operating the semiconductor memory, compared to the first variable resistance element; and a material layer interposed between the second variable resistance element and the second line or between the second variable resistance element and the third line, and showing an ohmic behavior in an operating current or voltage of the semiconductor memory. Through this, fabricating processes may be simplified and defects may be prevented in the cache memory unit 1120. As a consequence, fabricating processes may be simplified and defects may be prevented in the processor 1100.

Although it was shown in FIG. 5 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 6:
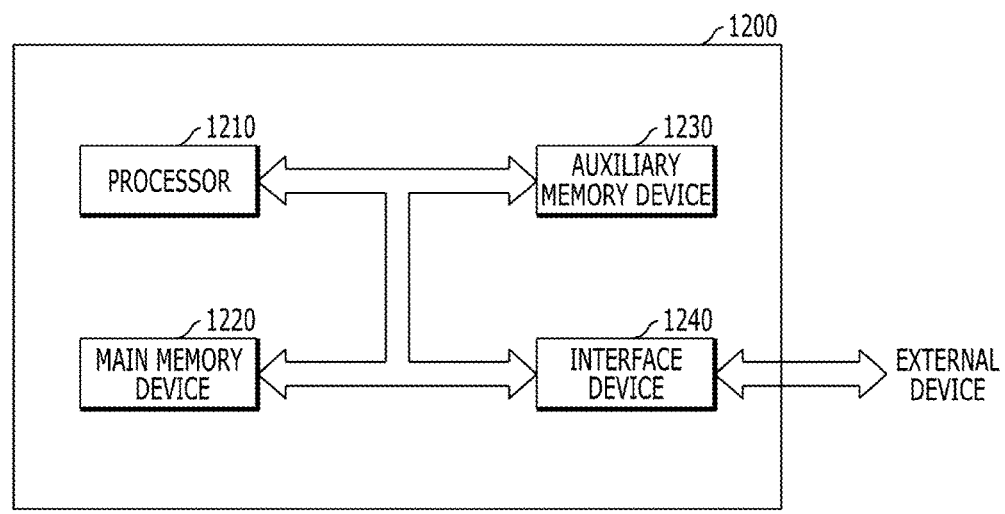
FIG. 6 is an example of configuration diagram of a system implementing memory circuitry according to an implementation of the disclosed technology.

FIG. 6 is an example of configuration diagram of a system implementing memory circuitry according to an implementation of the disclosed technology.

Referring to FIG. 6, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a first line; a second line spaced apart from the first line and extending in a direction crossing the first line; a third line spaced apart from the second line and extending in a direction crossing the second line; a first variable resistance element interposed between the first line and the second line and overlapping an intersection of the first line and the second line; a second variable resistance element interposed between the second line and the third line and overlapping an intersection of the second line and the third line, the second variable resistance element being more vulnerable to heat generated during operating the semiconductor memory, compared to the first variable resistance element; and a material layer interposed between the second variable resistance element and the second line or between the second variable resistance element and the third line, and showing an ohmic behavior in an operating current or voltage of the semiconductor memory. Through this, fabricating processes may be simplified and defects may be prevented in the main memory device 1220. As a consequence, fabricating processes may be simplified and defects may be prevented in the system 1200.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a first line; a second line spaced apart from the first line and extending in a direction crossing the first line; a third line spaced apart from the second line and extending in a direction crossing the second line; a first variable resistance element interposed between the first line and the second line and overlapping an intersection of the first line and the second line; a second variable resistance element interposed between the second line and the third line and overlapping an intersection of the second line and the third line, the second variable resistance element being more vulnerable to heat generated during operating the semiconductor memory, compared to the first variable resistance element; and a material layer interposed between the second variable resistance element and the second line or between the second variable resistance element and the third line, and showing an ohmic behavior in an operating current or voltage of the semiconductor memory. Through this, fabricating processes may be simplified and defects may be prevented in the auxiliary memory device 1230. As a consequence, fabricating processes may be simplified and defects may be prevented in the system 1200.

Also, the auxiliary memory device 1230 may further include a data storage system (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 7) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 7:
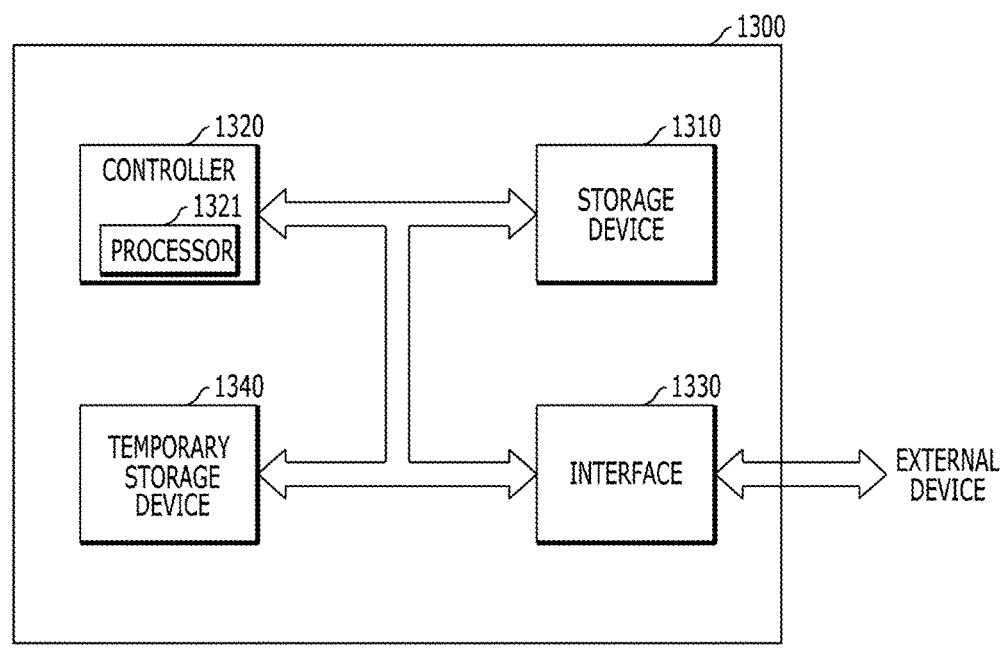
FIG. 7 is an example of configuration diagram of a data storage system implementing memory circuitry according to an implementation of the disclosed technology.

FIG. 7 is an example of configuration diagram of a data storage system implementing memory circuitry according to an implementation of the disclosed technology.

Referring to FIG. 7, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a first line; a second line spaced apart from the first line and extending in a direction crossing the first line; a third line spaced apart from the second line and extending in a direction crossing the second line; a first variable resistance element interposed between the first line and the second line and overlapping an intersection of the first line and the second line; a second variable resistance element interposed between the second line and the third line and overlapping an intersection of the second line and the third line, the second variable resistance element being more vulnerable to heat generated during operating the semiconductor memory, compared to the first variable resistance element; and a material layer interposed between the second variable resistance element and the second line or between the second variable resistance element and the third line, and showing an ohmic behavior in an operating current or voltage of the semiconductor memory. Through this, fabricating processes may be simplified and defects may be prevented in the temporary storage device 1340. As a consequence, fabricating processes may be simplified and defects may be prevented in the data storage system 1300.

Figure 8:
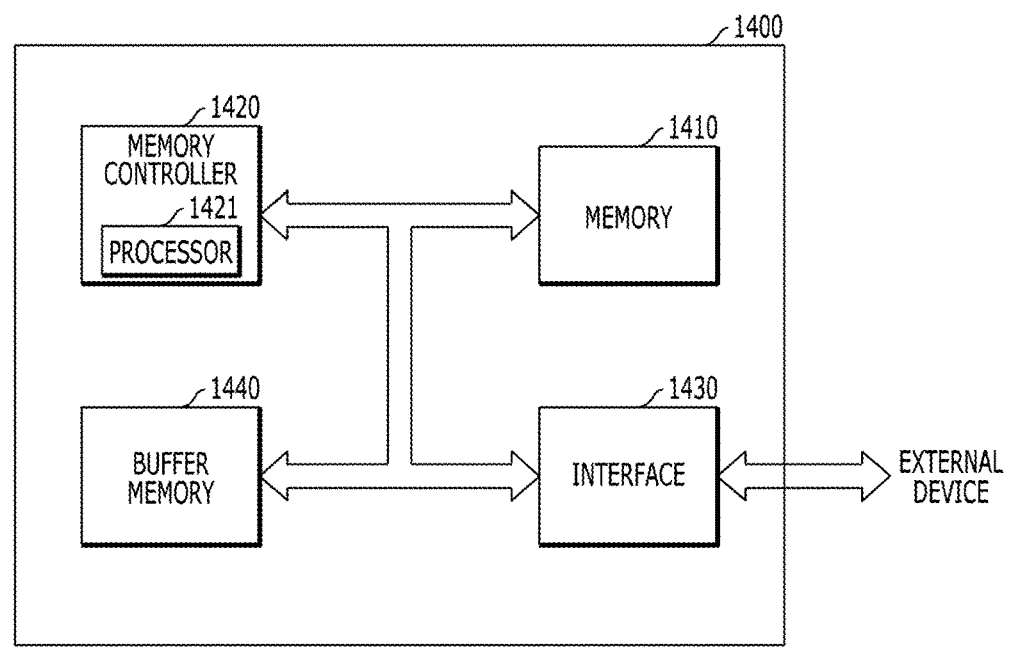
FIG. 8 is an example of configuration diagram of a memory system implementing memory circuitry according to an implementation of the disclosed technology.

FIG. 8 is an example of configuration diagram of a memory system implementing memory circuitry according to an implementation of the disclosed technology.

Referring to FIG. 8, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a first line; a second line spaced apart from the first line and extending in a direction crossing the first line; a third line spaced apart from the second line and extending in a direction crossing the second line; a first variable resistance element interposed between the first line and the second line and overlapping an intersection of the first line and the second line; a second variable resistance element interposed between the second line and the third line and overlapping an intersection of the second line and the third line, the second variable resistance element being more vulnerable to heat generated during operating the semiconductor memory, compared to the first variable resistance element; and a material layer interposed between the second variable resistance element and the second line or between the second variable resistance element and the third line, and showing an ohmic behavior in an operating current or voltage of the semiconductor memory. Through this, fabricating processes may be simplified and defects may be prevented in the memory 1410. As a consequence, fabricating processes may be simplified and defects may be prevented in the memory system 1400.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a first line; a second line spaced apart from the first line and extending in a direction crossing the first line; a third line spaced apart from the second line and extending in a direction crossing the second line; a first variable resistance element interposed between the first line and the second line and overlapping an intersection of the first line and the second line; a second variable resistance element interposed between the second line and the third line and overlapping an intersection of the second line and the third line, the second variable resistance element being more vulnerable to heat generated during operating the semiconductor memory, compared to the first variable resistance element; and a material layer interposed between the second variable resistance element and the second line or between the second variable resistance element and the third line, and showing an ohmic behavior in an operating current or voltage of the semiconductor memory. Through this, fabricating processes may be simplified and defects may be prevented in the buffer memory 1440. As a consequence, fabricating processes may be simplified and defects may be prevented in the memory system 1400.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 4-8 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device, comprising a semiconductor memory that includes:
    a first line;
    a second line being spaced apart from the first line and extending in a direction that crosses the first line;
    a third line being spaced apart from the second line and extending in a direction that crosses the second line;
    a first variable resistance element interposed between the first line and the second line, the first variable resistance element overlapping an intersection of the first line and the second line;
    a second variable resistance element interposed between the second line and the third line, the second variable resistance element overlapping an intersection of the second line and the third line, a part of the second variable resistance element being configured to generate a greater amount of heat than a part of the first variable resistance element when a direction of a current flowing through the first variable resistance element is opposite to a direction of a current flowing through the second variable resistance element; and
    a material layer connected in series with the second variable resistance element and disposed between the second line and the third line, the material layer exhibiting an electrical resistance.

2. The electronic device according to claim 1, wherein the material layer includes an insulating material having a sufficient thickness to exhibit the electrical resistance.

3. The electronic device according to claim 2, wherein the insulating material includes a metal oxide, a silicon oxide, a silicon nitride, or a combination thereof.

4. The electronic device according to claim 1, wherein the material layer is amorphous.

5. The electronic device according to claim 1, wherein a surface of the material layer is in contact with a first surface of the second variable resistance element and the surface of the material layer has a larger size than the first surface of the second variable resistance element.

6. The electronic device according to claim 1, wherein the direction of the current flowing through the second variable resistance element is a direction from the second line toward the third line, and the material layer is interposed between the second variable resistance element and the second line.

7. The electronic device according to claim 1, wherein the direction of the current flowing through the second variable resistance element is a direction from the third line toward the second line, and the material layer is interposed between the second variable resistance element and the third line.

8. An electronic device, comprising a semiconductor memory that includes:
    a first line;
    a second line being spaced apart from the first line and extending in a direction crossing the first line;
    a third line being spaced apart from the second line and extending in a direction crossing the second line;
    a first variable resistance element interposed between the first line and the second line, the first variable resistance element overlapping an intersection of the first line and the second line and including a first electrode layer, a first variable resistance layer, and a second electrode layer, which are stacked in a direction from the first line toward the second line;
    a second variable resistance element interposed between the second line and the third line, the second variable resistance element overlapping an intersection of the second line and the third line and including a third electrode layer, a second variable resistance layer, and a fourth electrode layer, which are stacked in a direction from the second line toward the third line, where a difference in Seebeck coefficients between a material of the first and third electrode layers and a material of the first and second variable resistance layers is different from a difference in Seebeck coefficients between a material of the second and fourth electrode layers and the material of the first and second variable resistance layers; and
    a material layer coupled in series to the second variable resistance element and disposed between the second line and the third line, the material layer having an electrical resistance.

9. The electronic device according to claim 8, wherein the difference in the Seebeck coefficients between the material of the first and third electrode layers and the material of the first and second variable resistance layers is smaller than the difference in the Seebeck coefficients between the material of the second and fourth electrode layers and the material of the first and second variable resistance layers,
    wherein a current flows through the first variable resistance element in a direction from the second line to the first line and a current flows through the second variable resistance element in a direction from the second line toward the third line, and
    wherein the material layer is interposed between the second line and the second variable resistance element.

10. The electronic device according to claim 8, wherein the difference in the Seebeck coefficients between the material of the first and third electrode layers and the material of the first and second variable resistance layers is larger than the difference in the Seebeck coefficients between the material of the second and fourth electrode layers and the material of the first and second variable resistance layers,
    wherein a current flows through the first variable resistance element in a direction from the second line toward the first line and a current flows through the second variable resistance element in a direction from the second line toward the third line, and
    wherein the material layer is interposed between the second line and the first variable resistance element.

11. The electronic device according to claim 8, wherein the difference in the Seebeck coefficients between the material of the first and third electrode layers and the material of the first and second variable resistance layers is smaller than the difference in the Seebeck coefficients between the material of the second and fourth electrode layers and the material of the first and second variable resistance layers, wherein a current flows through the first variable resistance element in a direction from the first line to the second line and a current flows through the second variable resistance element in a direction from the third line toward the second line, and wherein the material layer is interposed between the first line and the first variable resistance element.

12. The electronic device according to claim 8, wherein the difference in the Seebeck coefficients between the material of the first and third electrode layers and the material of the first and second variable resistance layers is larger than the difference in the Seebeck coefficients between the material of the second and fourth electrode layers and the material of the first and second variable resistance layers, wherein a current flows through the first variable resistance element in a direction from the first line toward the second line and a current flows through the second variable resistance element from the third line toward the second line, and the material layer is interposed between the third line and the second variable resistance element.

13. The electronic device according to claim 8, wherein the material layer includes an insulating material having a sufficient thickness to exhibit the electrical resistance.

14. The electronic device according to claim 13, wherein the insulating material includes a metal oxide, a silicon oxide, a silicon nitride, or a combination thereof.

15. The electronic device according to claim 8, wherein the material layer is amorphous.

16. The electronic device according to claim 8, wherein a surface of the material layer is in contact with a first surface, the first surface being a surface of the second variable resistance element or a surface of the first variable resistance element, the surface of the material layer having a larger size than the first surface.

17. An electronic device, comprising a semiconductor memory that includes:
- a first line;
- a second line spaced apart from the first line, the second line extending in a direction that crosses the first line;
- a third line spaced apart from the second line, the third line extending in a direction that crosses the second line;
- a first variable resistance element interposed between the first line and the second line, the first variable resistance element overlapping an intersection of the first line and the second line and having a multi-layered structure including a first variable resistance layer;
- a second variable resistance element interposed between the second line and the third line, the second variable resistance element overlapping an intersection of the second line and the third line and having a multi-layered structure including a second variable resistance layer; and
- a material layer having an electrical resistance, wherein the material layer is interposed between the second variable resistance element and one of the second line and the third line, and wherein a current flow path to the second variable resistance layer is longer than a current flow path to the first variable resistance layer.

18. The electronic device according to claim 17, wherein the material layer includes an insulating material having a sufficient thickness to exhibit the electrical resistance.

19. The electronic device according to claim 18, wherein the insulating material includes a metal oxide, a silicon oxide, a silicon nitride, or a combination thereof.

20. The electronic device according to claim 17, wherein the material layer is amorphous.

21. The electronic device according to claim 17, wherein a surface of the material layer is in contact with a first surface of the second variable resistance element, the surface of the material layer having a larger size than the first surface.

22. The electronic device according to claim 17, wherein, during operating the semiconductor memory, a direction of a current flowing through the first variable resistance element is opposite to a direction of a current flowing through the second variable resistance element.

23. The electronic device according to claim 22, wherein the direction of the current flowing through the second variable resistance element is a direction from the second line toward the third line, and wherein the material layer is interposed between the second variable resistance element and the second line.

24. The electronic device according to claim 22, wherein the direction of the current flowing through the second variable resistance element is a direction from the third line toward the second line, and wherein the material layer is interposed between the second variable resistance element and the third line.

25. An electronic device, comprising a semiconductor memory that includes:
- a first line;
- a second line being spaced apart from the first line and extending in a direction that crosses the first line;
- a third line being spaced apart from the second line and extending in a direction that crosses the second line;
- a first variable resistance element interposed between the first line and the second line, the first variable resistance element overlapping an intersection of the first line and the second line and including a first phase change material;
- a second variable resistance element interposed between the second line and the third line, the second variable resistance element overlapping an intersection of the second line and the third line and including a second phase change material, a magnitude of a current required for a phase change of the second phase change material being smaller than a magnitude of a current required for a phase change of the first phase change material when a direction of a current flowing through the first variable resistance element is opposite to a direction of a current flowing through the second variable resistance element; and
- a material layer connected in series with the second variable resistance element and disposed between the second line and the third line, the material layer exhibiting an electrical resistance.

* * * * *